United States Patent
Cosgrave et al.

(10) Patent No.: US 10,267,870 B2
(45) Date of Patent: Apr. 23, 2019

(54) DETECTING SENSOR ERROR

(71) Applicant: Analog Devices Global, Hamilton (BM)

(72) Inventors: Gavin Patrick Cosgrave, Enniscorthy (IE); Dermot G. O'Keeffe, Blarney (IE)

(73) Assignee: Analog Devices Global, Hamilton (BM)

(*) Notice: Subject to any disclaimer, the term of this patent is extended or adjusted under 35 U.S.C. 154(b) by 194 days.

(21) Appl. No.: 15/048,712

(22) Filed: Feb. 19, 2016

(65) Prior Publication Data

US 2016/0245893 A1 Aug. 25, 2016

Related U.S. Application Data

(60) Provisional application No. 62/118,937, filed on Feb. 20, 2015.

(51) Int. Cl.
| | |
|---|---|
| *G01D 5/24* | (2006.01) |
| *G01R 33/09* | (2006.01) |
| *G01D 5/244* | (2006.01) |
| *G01R 35/00* | (2006.01) |
| *G01R 31/28* | (2006.01) |

(52) U.S. Cl.
CPC ....... *G01R 33/096* (2013.01); *G01D 5/24485* (2013.01); *G01R 31/2829* (2013.01); *G01R 35/00* (2013.01)

(58) Field of Classification Search
CPC .. G01R 33/096; G01R 31/2829; G01R 35/00; G01D 5/24485
See application file for complete search history.

(56) References Cited

U.S. PATENT DOCUMENTS

| | | |
|---|---|---|
| 5,927,430 A | 7/1999 | Yoshinobu et al. |
| 6,191,579 B1 | 2/2001 | Striker |
| 6,304,074 B1 | 10/2001 | Waffenschmidt |
| (Continued) | | |

FOREIGN PATENT DOCUMENTS

| | | |
|---|---|---|
| CN | 1754080 | 3/2006 |
| CN | 101419049 | 4/2009 |
| (Continued) | | |

OTHER PUBLICATIONS

German Office Action dated Nov. 16, 2016 for German Patent Application No. 10 2016 102 929.7.

(Continued)

*Primary Examiner* — Huy Q Phan
*Assistant Examiner* — Adam Clarke
(74) *Attorney, Agent, or Firm* — Knobbe Martens Olson & Bear LLP

(57) ABSTRACT

Sensor error detection with an additional sensing channel is disclosed herein. First, second, third sensing elements can be disposed at angles relative to one another. In some embodiments, the first, second, and third sensing elements can be magnetic sensing elements, such as anisotropic magnetoresistance (AMR) sensing elements. Sensor data from first, second, and third sensing channels, respectively having the first, second, and third sensing elements, can be obtained. Expected third sensing channel data can be determined and compared to the obtained third sensing channel data to indicate error.

20 Claims, 5 Drawing Sheets

(56) References Cited

U.S. PATENT DOCUMENTS

| | | | |
|---|---|---|---|
| 6,633,462 | B2 | 10/2003 | Adelerhof |
| 7,227,353 | B2 | 6/2007 | Shigetoshi et al. |
| 7,408,343 | B2 | 8/2008 | Dmytriw et al. |
| 7,694,777 | B2 | 4/2010 | Masaharu et al. |
| 7,847,542 | B2 | 12/2010 | Bartos et al. |
| 7,956,610 | B2 | 6/2011 | Granig et al. |
| 7,965,074 | B2 | 6/2011 | Nakagawa et al. |
| 8,232,795 | B2 | 7/2012 | Saruki et al. |
| 8,258,782 | B2 | 9/2012 | Kaita et al. |
| 8,729,892 | B2 | 5/2014 | Friedrich |
| 8,884,616 | B2 | 11/2014 | Zimmer et al. |
| 9,097,509 | B2 | 8/2015 | Abe et al. |
| 2003/0052669 | A1 | 3/2003 | Enomoto et al. |
| 2008/0234891 | A1 | 9/2008 | Pyo |
| 2008/0278158 | A1 | 11/2008 | Granig et al. |
| 2009/0206827 | A1 | 8/2009 | Aimuta et al. |
| 2010/0171488 | A1 | 7/2010 | Wipenmyr et al. |
| 2012/0025808 | A1 | 2/2012 | Granig et al. |
| 2013/0289936 | A1 | 10/2013 | Houda |
| 2014/0028294 | A1 | 1/2014 | Granig et al. |
| 2014/0191625 | A1* | 7/2014 | Kitamoto ............... G01D 3/08 310/68 B |
| 2014/0197818 | A1 | 7/2014 | Stanley |
| 2014/0292313 | A1 | 10/2014 | Ueda et al. |
| 2015/0108971 | A1 | 4/2015 | Granig et al. |
| 2015/0176963 | A1* | 6/2015 | Diaconu ............... G01R 33/077 702/95 |
| 2015/0176964 | A1* | 6/2015 | Uberti ............... G01R 33/0029 702/95 |
| 2015/0241523 | A1 | 8/2015 | Scherr |
| 2015/0377646 | A1* | 12/2015 | Meyer ............... G01D 5/14 324/207.25 |
| 2016/0123780 | A1 | 5/2016 | Snyder et al. |
| 2016/0245677 | A1 | 8/2016 | Cosgrave et al. |
| 2016/0291114 | A1* | 10/2016 | Bacquet ............ G01R 31/3658 |

FOREIGN PATENT DOCUMENTS

| | | |
|---|---|---|
| CN | 101603808 | 12/2009 |
| CN | 101995558 | 3/2011 |
| DE | 000004412982 | 9/1995 |
| DE | 198 34 454 | 2/1999 |
| DE | 101 01 174 | 7/2002 |
| DE | 102 11 017 | 10/2003 |
| DE | 10 2004 041 559 | 3/2005 |
| DE | 10 2007 037 639 | 3/2008 |
| EP | 2 960 666 A1 | 12/2015 |
| JP | 10-132506 | 5/1998 |
| JP | 2006-105932 A | 4/2006 |
| WO | WO 2005/101043 A1 | 10/2005 |

OTHER PUBLICATIONS

Analog Devices, Integrated AMR Angle Sensor and Signal Conditioner, ADA4571 Data Sheet, Rev. 0, Oct. 2014, 21 pages.
Analog Devices, Magnetoresistive Angle Measurement, Analog Devices—Circuit Note CN-0323, Rev. 0, Oct. 2013, 6 pages.
Dilger, "On a redundant diversified steering angle sensor", *On-Line Testing Symposium. IOLTS. 9th IEEE*, (Jul. 2003), pp. 191-196.
Giebeler, Robust GMR sensors for angle detection and rotation speed sensing, Elsevier, Sensors and Actuators A 91 (2001) 16-20.
Guyol, AMR Angle Sensors, Analog Devices—AN-1314 Application Note, Rev. 0, Oct. 2014, 10 pages.
Ripka, "Crossfield Sensitivity in AMR Sensors", *Magnetics IEEE Transactions on*, vol. 45, pp. 4514-4517, 2009, ISSN 0018-9464.
Treutler, Magnetic sensors for automotive applications, Elsevier, Sensors and Actuators A 91 (2001) 2-6.
Combined Search Report and Examination Report in United Kingdom Patent Application No. GB1602902.7, dated Sep. 9, 2016, 9 pages.
Office Action dated Mar. 19, 2018 for United Kingdom Patent Application No. GB1602902.7, 5 pages.
Office Action dated Feb. 14, 2018 for Chinese Patent Application No. 201610093438.8, 5 pages.

* cited by examiner

DETECTING SENSOR ERROR

CROSS-REFERENCE TO RELATED APPLICATION

This application claims the benefit under 35 U.S.C. § 119(e) of U.S. Provisional Application No. 62/118,937, filed Feb. 20, 2015, and titled "DETECTING SENSOR ERROR," the entirety of which is hereby incorporated by reference.

BACKGROUND

Technical Field

The described technology generated relates to detecting sensor errors and, more specifically, to apparatus and methods for detecting sensor errors through redundancy.

Description of the Related Art

Magnetic sensors can be implemented to obtain linear or circular position or angle information of a mechanical component, such as a shaft, in various applications, including an automotive steering system. Magnetic sensing elements used in magnetic angle sensors often suffer from changing sensitivity levels and non-linearity errors due to, for example, temperature change, and it is desirable to implement a sensor error detection mechanism for magnetic sensors.

SUMMARY OF CERTAIN INVENTIVE ASPECTS

The methods and devices of the described technology each have several aspects, no single one of which is solely responsible for its desirable attributes.

One embodiment is an apparatus for detecting sensor error, the apparatus including a first sensing channel including a first magnetic sensing element, a second sensing channel including a second magnetic sensing element, the second sensing element oriented at a first angle relative to the first sensing element, a third sensing channel including third magnetic sensing element, the third sensing element oriented at a second angle relative to the first sensing element, the second angle being different from the first angle, and a processor. The processor is configured to receive first sensor data from the first sensing channel, second sensor data from the second sensing channel, and third sensor data from the third sensing channel, compute expected third sensor data from the first sensor data and the second sensor data, and detect sensor error based at least partly on a comparison of the expected third sensor data with the third sensor data.

Another embodiment is a method for detecting sensor error, the method including receiving first sensor data from a first sensing channel, second sensor data from a second sensing channel, and third sensor data associated with a third sensing channel, determining an angle and a radius based at least partly on the first sensor data and the second sensor data, computing the expected third sensor data based at least partly on the angle and the radius, and detecting sensor error based at least partly on a comparison of the expected third sensor data with the third sensor data. The first sensing channel includes a first magnetic sensing element, and the second sensing channel includes a second magnetic sensing element, the second sensing element oriented at a first angle relative to the first sensing element. The third sensing channel includes third magnetic sensing element, the third sensing element oriented at a second angle relative to the first sensing element, the second angle being different from the first angle.

The method for detecting sensor error can further include determining the angle using an arctan function. The method for detecting sensor error can further include providing an error flag responsive to the detected error satisfying a threshold. Each of the first, second, and third magnetic sensing elements can be a magnetoresistive sensor, such as an anisotropic magnetoresistance (AMR) sensor. The second angle can be approximately half of the first angle. For instance, the first angle can be approximately 45 degrees and the second angle can be approximately 22.5 degrees.

Another embodiment is an apparatus for detecting sensor error, the apparatus including a first sensing channel including a first magnetic sensing element, a second sensing channel including a second magnetic sensing element, a third sensing channel, and a processor. The processor is configured to receive first sensor data from the first sensing channel, second sensor data from the second sensing channel, and third sensor data from the third sensing channel, determine an angle and a radius based at least partly on the first sensor data and the second sensor data, compute the expected third sensor data based at least partly on the angle and the radius, and detect sensor error based at least partly on a comparison of the expected third sensor data with the third sensor data.

The processor can be further configured to determine an angle and a radius based at least partly on the first sensor data and the second sensor data and compute the value based at least partly on the angle and the radius. The processor can be further configured to compute the angle using an arctan function.

The third sensing channel can include a third magnetic sensing element. Each of the first, second, and third sensing elements can be an anisotropic magnetoresistance (AMR) sensor. The second sensing element can be oriented at a first angle relative to the first sensing element. The third sensing element can be oriented at a second angle relative to the first sensing element. The second angle can be approximately half of the first angle. The first angle can be approximately 45 degrees and the second angle can be approximately 22.5 degrees. Each of the first, second, and third sensing channels can further comprise an amplifier and a sampling circuit. The first, second, and third sensing channels can be embodied in a single die. The first, second, and third sensing elements can be collocated. Each of the first, second, and third sensing elements can be configured to provide a differential output. The apparatus can be configured to provide an error flag responsive to the detected error satisfying a threshold. Another embodiment can be an electronic power assisted steering system including the abovementioned apparatus for detecting sensor error.

BRIEF DESCRIPTION OF THE DRAWINGS

These drawings and the associated description herein are provided to illustrate specific embodiments of the invention and are not intended to be limiting.

DETAILED DESCRIPTION OF CERTAIN EMBODIMENTS

Figure 1A:
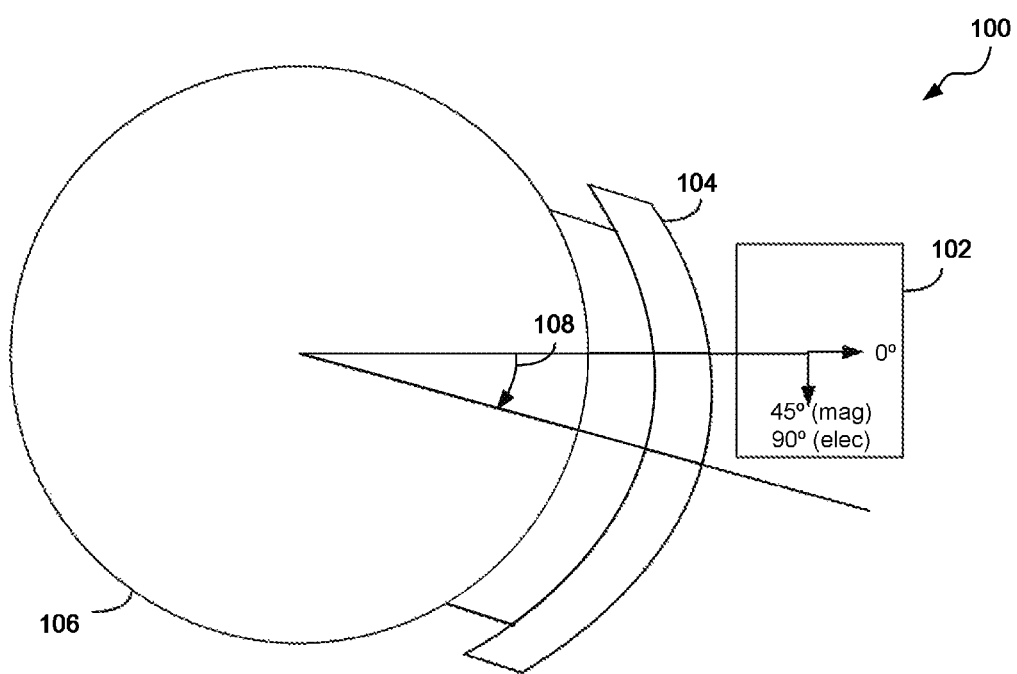
FIG. 1A is a diagram of an example implementation of the technology disclosed herein according to one embodiment.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to automotive systems and/or different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Sensor error detection with an additional sensing channel is disclosed herein. First, second, third sensing elements can be oriented at angles relative to one another. These sensing elements can otherwise be substantially the same. The first, second, and third sensing elements can be co-located. Sensor data from the first, second, and third sensing channels having the first, second, and third sensing elements, respectively, can be obtained. Expected third sensing channel data can be determined and compared to the obtained third sensing channel data to detect error.

In some embodiments, the disclosure herein may be applied to an apparatus having a rotating shaft, which may include one or more magnetic elements such as dipole or ring magnets. A measurement of the magnetic field by the sensing elements can be used to determine the angle of rotation of the shaft and a radius representative of synchronous multichannel sensor outputs, for example. In some embodiments, the magnetic angle of rotation $\text{ANGLE}_{MAG}$ can be calculated as:

$$\text{ANGLE}_{MAG} = \frac{\arctan\left(\frac{V_{SIN}}{V_{COS}}\right)}{2} \quad \text{(Equation 1)}$$

and the sensor output radius $V_{RAD}$ can be determined as:

$$V_{RAD} = \sqrt{\left(V_{SIN} - \frac{V_{REF}}{2}\right)^2 + \left(V_{COS} - \frac{V_{REF}}{2}\right)^2} \quad \text{(Equation 2)}$$

where $V_{SIN}$ and $V_{COS}$ are respective output voltages of two sensing channels, for example, with their sensing elements oriented at a physical angle of about 45° with each other, the sensor output radius $V_{RAD}$ is a voltage representative of synchronized outputs of the two sensing channels, and where $V_{REF}$ is the reference voltage applied to the sensing elements.

The sensor output radius $V_{RAD}$ can be substantially constant at a given temperature when the two sensing channel data ($V_{SIN}$ and $V_{COS}$) are synchronized, and a significant deviation from the calculated radius voltage at a given temperature may indicate an error or a defect in the system. As further described herein in connection with Equations 3 and 4 below, the sensor output radius $V_{RAD}$ can be understood as a temperature-dependent value, which allows determination of expected sensing channel values according to Equation 5 below. Alternatively, the sensing channel data $V_{SIN}$ and $V_{COS}$ can be determined according to the deviation from their output at 0 degrees magnetic field angle without determining the sensor output radius $V_{RAD}$ using $V_{REF}$. In other embodiments, the error detection disclosed herein can be applied to an apparatus measuring parameters other than a rotation angle, such as length or current.

FIG. 1A shows a diagram of an example implementation of the technology disclosed herein according to one embodiment. The illustrated implementation 100 includes a shaft 106, a magnet 104, and a sensing circuit 102. A rotation angle 108 is also illustrated in FIG. 1A. Embodiments of the sensing circuit 102 are further described in connection with FIGS. 1B to 2B below. The magnet 104 can be attached to the rotating shaft 106. The rotating shaft 106 can be associated with a steering wheel of a motor vehicle in certain implementations. The sensing circuit 102 can sense changes in position of the magnet 104 and provide an indication of rotation of the rotating shaft 106. In embodiments including magnetic elements on a rotating shaft (e.g., the shaft 106), magnetic sensors such as anisotropic magnetoresistive (AMR) sensors, giant magnetoresistive (GMR), or tunneling magnetoresistive (TMR) sensors, or any other suitable magnetoresistive (XMR) sensors can be used as sensing elements to implement the disclosed apparatus and/or methods. In some embodiments, the magnetic sensors can measure the magnetic field based on the change in resistivity that is proportional to the perpendicular magnetic field. By using magnetic sensors, such as AMR sensors, and various combinations of sensing elements of the magnetic sensor, an error can be detected according to aspects of this disclosure. For instance, embodiments described herein can overcome challenges related to angle sensor errors due to, for example, shorting of resistive sensing elements of AMR sensors, electrostatic discharge (ESD) leakage of output circuit(s), damages to one or more filters (e.g., electromagnetic compatibility (EMC) filter), gain errors, nonlinearity errors, the like, or any combination thereof.

In other embodiments, other types of sensing elements that obtain positional information from a differential Sine and/or Cosine output may be used to implement the error detection apparatus and methods described herein. For example, elements such as a resolver, Hall Effect sensing elements, optical sensing elements, or any combination thereof may be used. Furthermore, the disclosure herein can provide self-checking of sensing error regardless of sensor variations due to temperature, for example.

Aspects of this disclosure can be implemented in a magnetic angle sensor including, for example, the sensing circuit 102. Such a magnetic sensor can include AMR sensing elements, signal conditioning electronics and an interface. In one application, the interface can be a peripheral acceleration sensor (PAS) interface, such as a PAS4 interface for remote accelerometers used for airbag deployment in vehicles, for communication with a host electronic control unit (ECU). The magnetic angle sensor can be implemented in an automotive Electric Power Assisted Steering (ePAS) system. Such a system has a functional safety specification defined in accordance with ISO-26262, which is a functional safety standard for road vehicles. The principles and advantages discussed herein can be implemented to verify angle and/or radius measurements (e.g., rotation of the shaft 106 associated with a steering wheel) in an ePAS system to satisfy a functional safety specification. In other instances, the illustrated implementation 100 can be used in other systems complying with other specifications or standards, or systems requiring relatively low error in and/or robust cross-checking of angle sensing. In some embodiments, the sensing ranges of magnetic, mechanical, and/or electrical angles can be different from each other. For example, in an embodiment using AMR sensors, such as illustrated in the sensing circuit 102 of FIG. 1A, a 90° rotation in electrical angle may correspond to a 45° rotation in magnetic angle.

As described herein "electrical angle" can be understood as the angle calculated from $\arctan(V_{SIN}/V_{COS})$, and as described above "magnetic angle" can be understood as $ANGLE_{MAG}$ calculated according to Equation 1 above. The "magnetic angle" can be the "electrical angle" divided by 2. Also as described herein "mechanical angle" can be understood as the angle determined based on the magnet design, which can be reflected in a mechanical-to-magnetic angle transfer function. In embodiments using a single pole-pair magnet, the "mechanical angle" and "magnetic angle" are the same. In embodiments using a multi-pole magnet, such a pole-ring, the "mechanical angle" can be expressed as ($ANGLE_{MAG}/N$), where N is the number of pole pairs.

Figure 1B:
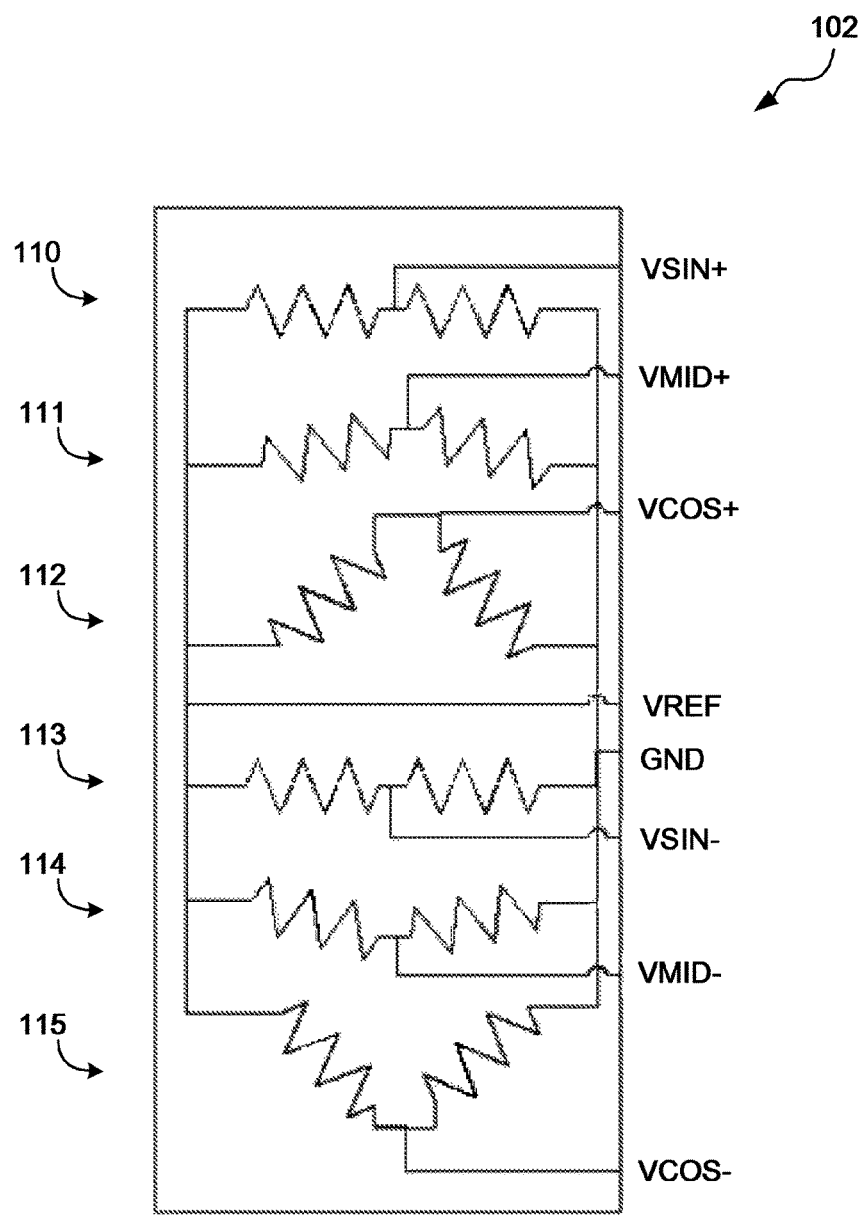
FIG. 1B is a diagram of an example implementation of the sensing circuit 102 of FIG. 1A according to one embodiment.
Figure 2A:
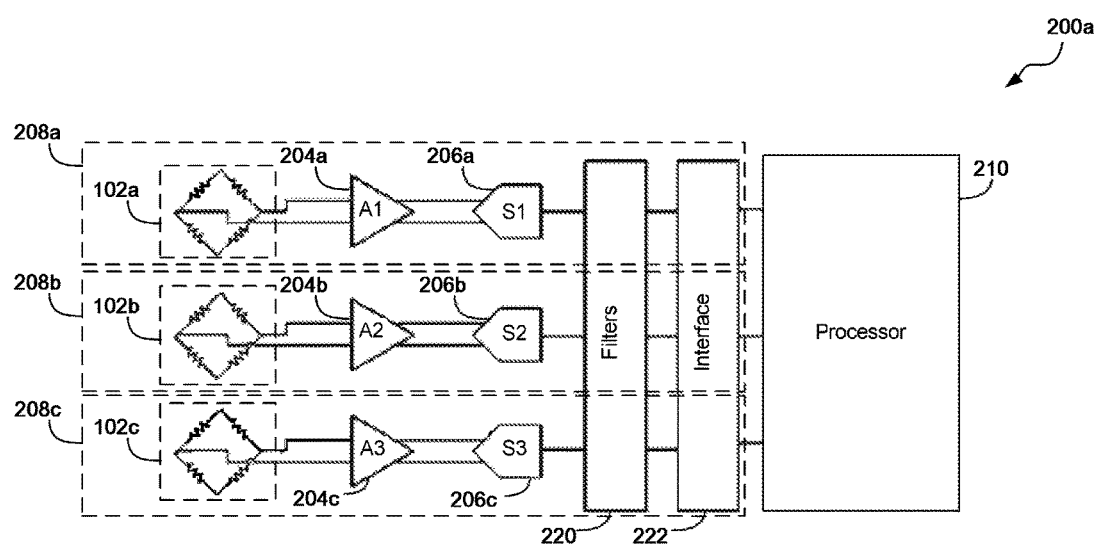
FIG. 2A is a block diagram of an example implementation that includes three sensing channels and a processor according to one embodiment.
Figure 2B:
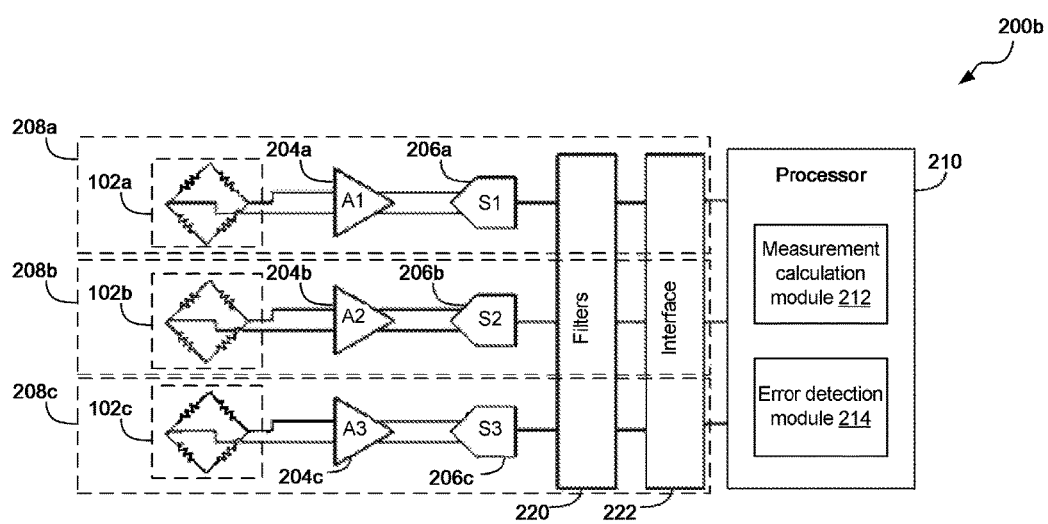
FIG. 2B is a block diagram of another example implementation that includes three sensing channels and a processor according to one embodiment.

FIG. 1B shows a diagram of example implementation of the sensing circuit 102 of FIG. 1A according to one embodiment. A sensing circuit may have a plurality of half bridges, and the example sensing circuit illustrated in FIG. 1B includes a system of sensing elements of six half bridges 110, 111, 112, 113, 114, and 115 (each comprising two resistive elements with a bridge output node between the two resistive elements) and six corresponding half bridge output nodes $V_{SIN+}$, $V_{MID+}$, $V_{COS+}$, $V_{SIN-}$, $V_{MID-}$, and $V_{COS-}$ respectively. The six half bridges 110, 111, 112, 113, 114, and 115 can form three full bridges in combination (e.g., the combination of half bridges 110 and 113 can form a first full bridge, the combination of half bridges 111 and 114 can form a second full bridge, and the combination of half bridges 112 and 115 can form a third full bridge). In some implementations, the reference voltage $V_{REF}$ can be a supply voltage $V_{DD}$. Each of the three full bridges may correspond to each of sensing elements 102a, 102b, and 102c (FIGS. 2A-2B). Accordingly, each sensing channel of FIGS. 2A-2B can include a full bridge.

The plurality of full bridges disclosed herein can be oriented at angles relative to one another and configured to be sensitive to a magnetic field in different directions. In FIG. 1B, the second full bridge (i.e., the combination of half bridges 111 and 114) is oriented at a 22.5° angle relative the first full bridge (i.e., the combination of half bridges 110 and 113) and the third full bridge (i.e., the combination of half bridges 112 and 115) is oriented at a 45° angle relative the first full bridge. These angles can be magnetic angles. In other embodiments, the relative angles between the three full bridges (or the six half bridges) to each other can be values other than 22.5° and 45° as long as a unique solution for the angular position can be determined from the outputs of the sensing elements disposed at different angles. Aside from having different orientations and electrical connections, the full bridges can be substantially the same as each other in certain implementations. The full bridges illustrated in FIG. 1B can be co-located, at least partially overlapping, situated side-by-side, and/or included on a single die or within a single package. One sensing element being oriented at an angle relative to another sensing element encompasses being oriented at any suitable non-zero angle relative to another sensing element.

In some embodiments, each of sensing element outputs (e.g., outputs from sensing elements 102a, 102b, and 102c in FIGS. 2A-2B below) can be based on the outputs from the pairs of half bridges (e.g., the output $V_{SIN}$ across $V_{SIN+}$ and $V_{SIN-}$, the output $V_{MID}$ across $V_{MID+}$ and $V_{MID-}$, and the output $V_{COS}$ across $V_{COS+}$ and $V_{COS-}$); thus, the illustrated sensing circuit 102 may generate three bridge outputs $V_{SIN}$, $V_{MID}$, and $V_{COS}$, which can be further processed or conditioned using various elements disclosed in FIGS. 2A-2B, to produce corresponding sensor channel data. As further described below, a plurality of sensing element outputs may be used to determine the angle of rotation and sensor radius and detect sensor errors. In other embodiments, the system of sensing elements may include a different number of full bridges than illustrated in FIG. 1B or use different combination of half bridges than described above. In some embodiments, the disclosed herein can be implemented with three sensing channels each having a full bridge, which may increase redundancy and independence between the sensing channels and, in turn, may allow a robust detection of sensing error.

FIG. 2A is a block diagram of an example implementation according to one embodiment. The illustrated circuit 200a includes three sensing channels each having a sensing element 102a, 102b, or 102c, which can be part of the sensing circuit 102 described above in connection with FIGS. 1A-1B. The illustrated circuit 200a also includes differential amplifiers 204a, 204b, and 204c, sampling circuits 206a, 206b, and 206c, filters 220, an interface 222, and a processor 210. The filters 220 can include filters for removing undesired signal(s), and the interface 222 may include an interface for communicating with a host processing unit (e.g., the processor 210) or any other modules. The interface 222 can be a PAS4 interface, for example. In some embodiments, a sensing channel (e.g., 208a, 208b, 208c) can include an amplifier, a sampling circuit and/or any other circuitry to process signals from the sensing circuit 102 in a signal path to the processor 210. The sampling circuits 206a, 206b, and 206c can each include, for example, an analog-to-digital converter (ADC), such as sigma-delta ADC. It should be noted that FIGS. 2A-2B do not illustrate physical orientation of the sensing elements 102a, 102b, and 102c as the sensing elements 102a 102b, and 102c are oriented at an angle with respect to one another, for example, as described in connection with FIG. 1B above. FIGS. 2A-2B may further include analog circuit elements to reduce computation by the processor 210.

Still referring to FIG. 2A, two channels (e.g., the channels including the sensing elements 102a and 102b) can be used to calculate an angle from the conditioned bridge outputs (e.g., the data $V_{SIN}$ and the output $V_{COS}$). It is to be noted that the various equations or relationships involving $V_{SIN}$, $V_{MID}$, and $V_{COS}$ described herein can be applicable to either the direct outputs from the sensing elements 102a, 102b, and 102c or their respective channel signals or data after being at least partially being processed through, for example, the amplifiers 204a, 204b, and 204c, the sampling circuits 206a, 206b, and 206c, the filters 220, and/or the interface 222 in FIG. 2A. The angle can be calculated from the two channels based on the bridges' responses to external magnetic angle stimulus produced, for example, by rotating the shaft 106 (FIG. 1A). The bridge outputs can have a sinusoidal response to magnetic angle, and in embodiments having the first and second sensing elements 102a and 102b, respectively, oriented at about 45° relative to each other, the two bridge outputs can be represented by the following equations:

$$V_{OUT\_CH1} = V_{RAD} \times \sin(2 \times ANGLE_{MAG}) \times \pi/180°$$ (Equation 3)

$$V_{OUT\_CH2} = V_{RAD} \times \sin(2 \times (ANGLE_{MAG} + 45°)) \times \pi/180°$$ (Equation 4)

where $V_{OUT\_CH1}$ and $V_{OUT\_CH2}$ are full bridge outputs of the two channels, such as $V_{SIN}$ and $V_{COS}$, and $V_{RAD}$ can be understood as a peak magnitude of output voltage of a sensing channel in a given environmental condition (e.g., temperature).

The voltage $V_{RAD}$ can vary significantly and with a non-linear relationship to temperature. Without knowing the value of $V_{RAD}$ at an operating temperature, for example, it can be difficult to accurately calculate the angle $ANGLE_{MAG}$ from any one of the sensing channels individually. Furthermore, at the peaks of the sinusoidal curve, sensitivity to angle change can be significantly reduced. As discussed above, the angle $ANGLE_{MAG}$ can be determined from using an arctan function (e.g., as shown in Equation 1) based on the two sensing channel outputs (e.g., $V_{SIN}$, $V_{COS}$). In some embodiments, it can be advantageous to calculate the angle $ANGLE_{MAG}$ using an arctan function since such implementation may mitigate issues concerning $V_{RAD}$ dependency and varying sensitivity to angular change. Furthermore, calculating the angle using an arctan function, such as a tan 2, can be also beneficial as it can be relatively easy to implement with a CORDIC algorithm on the controller (e.g., the processor 210).

In embodiments using both the first and second sensing channel outputs (corresponding, for example, to the outputs from the sensing elements 102a and 102b) to calculate magnetic angle, it may not be desirable to use the differential output voltage of the same channels to verify independently whether the angle determination is correct. A third sensing channel including the third sensor (e.g., the sensing dement 102c) can be used to independently sense magnetic field and verify the angle. As discussed above, the first sensing element 102a can be oriented at a first angle relative to the second sensing element 102b, and the third sensing element 102c can be oriented at a second angle relative to the first sensing element 102a. In some embodiments, to maximize sensitivity to errors associated with the sensing elements 102a and 102b, the sensing element 102c can be oriented at an angle that bisects the first angle. For example, when the first angle is about 45°, the second angle can be approximately 22.5°. The processor 210, which can be an electronic control unit (ECU), can compute a predicted output for the third sensing channel, for example, as shown below:

$$V_{OUT\_CH3} = V_{RAD} \times \sin(2 \times (ANGLE_{MAG} + 22.5°)) \times \pi/180°$$ (Equation 5)

where $ANGLE_{MAG}$ is the angle and $V_{RAD}$ is the radius calculated from outputs of the first and second sensing channels according to Equations 1 and 2 as discussed above, and where $V_{OUT\_CH3}$ is a full bridge output of the third channel, such as $V_{MID}$. In embodiments having different relative orientations of the first, second, and third sensing elements, Equations 3, 4, and 5 above can be modified accordingly to reflect their relative orientations. To simplify calculations, in the absence of a SIN function in the controller math library, SIN can be calculated using a Taylor Series approximation:

$$\sin z = z - \frac{z^3}{3!} + \frac{z^5}{5!} - \frac{z^7}{7!} + \dots \quad (|z| < \infty)$$ (Equation 6)

where z is $ANGLE_{MAG}$ in radians. For a relatively high accuracy, terms up to $z^{11}$ can be included. Depending on system specifications, other methods of approximation can be used or other number of terms can be used in a polynomial approximation in other implementations.

FIG. 2B is a block diagram of another example implementation according to one embodiment. The circuit 200b of FIG. 2B can implement any of the principles and advantages of the circuit 200a of FIG. 2A. As illustrated in FIG. 2B, the processor 210 includes a measurement calculation module 212 and an error detection module 214 to perform the various functions described herein. Each of these modules can be implemented with physical hardware. The measurement calculation module 212 can compute angle and radius. For example, the measurement calculation module 212 can compute angle in accordance with Equation 1 and radius in accordance with Equation 2. The measurement error detection module 214 can compare a value associated with data from the third sensing or processing channel with a value associated with the data from the first and second sensing or processing channels to detect whether there is a sensor error. The error detection module 214 can perform any suitable computations to support the comparison, such as computing expected third channel data from first channel data and second channel data. For instance, the error detection module 214 can compute expected third channel data in accordance with Equation 5 and compare the computed expected third channel data with data from the third channel. The third channel data can be data received from the third sensing channel or a value computed based on data received from the third sensing channel. In some embodiments, the error detector module 214 may indicate a sensor error if, for example, the difference between the expected or determined third channel data and the actual third channel data exceeds a threshold. The processor 210 in any of the illustrated embodiments can be implemented by, for example, a host electronic control unit (ECU) of an Electric Power Assisted Steering (ePAS) system.

Figure 3:
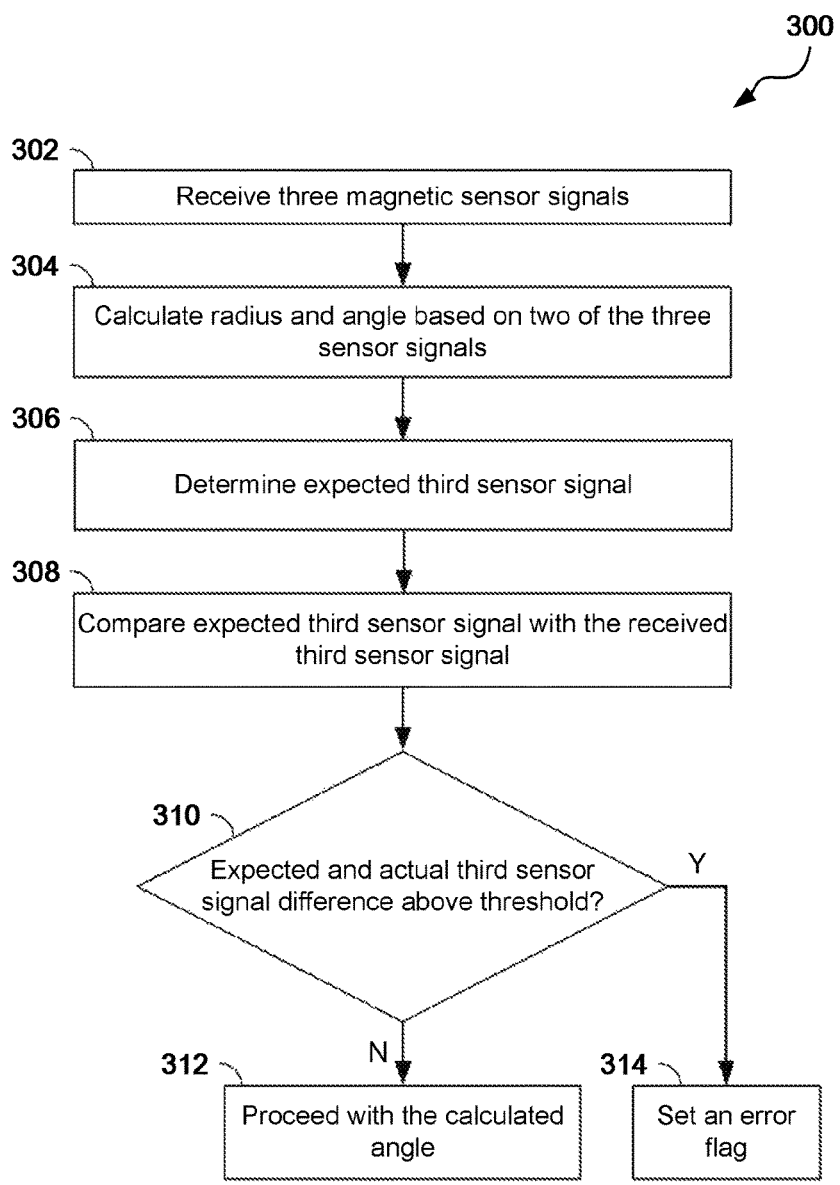
FIG. 3 is a flowchart of an example implementation of the error detection method described herein according to one embodiment.

FIG. 3 shows a flowchart of an example implementation of the error detection method described herein according to one embodiment. The method can be performed with the circuit elements and/or physical hardware associated with one or more modules of the processor 210 illustrated in FIGS. 2A-2B. It is to be noted that all or parts of operations 302, 304, 306, 308, 310, 312, and 314 may be concurrently, continuously, periodically, intermittently, repeatedly, or iteratively performed as appropriate, and the illustrated process 300 in FIG. 3 is only one example of the disclosed herein according to one embodiment.

In operation 302, the three magnetic sensor signals from three sensing channels are received. As discussed in connection with FIGS. 2A-2B above, the signals from the three sensing channels can be processed using the respective amplifiers 204a, 204b, and 204c, the respective sampling circuits 206a, 206b, and 206c, the filters 220, and the interface 222. The received magnetic sensor signals can be digital signals. Each of the three magnetic sensor signals obtained in operation 302 can correspond to the respective outputs of the sensing elements 102a, 102b, and 102c relatively oriented to one another according to the descriptions above.

In operation 304, the radius and angle values can be determined based at least in part on two of the three signals received in operation 302. In some embodiments, the angle value (e.g., $ANGLE_{MAG}$) can be determined according to Equation 1 discussed above and the radius value (e.g., $V_{RAD}$) can be determined according to Equation 2 discussed above based on the sensor signals from the first and second channels (e.g., 102a, 102b). In other embodiments, other types of two independent values can be determined based on two of the three signals received in operation 302 for purposes of detecting sensor error.

In operation 306, an expected value of the third sensor signal can be determined. In some embodiments, the expected value of the third sensor signal can be determined according to Equation 5 discussed above when the third sensing element is oriented at about 22.5° relative to the first sensing element, and the second sensing element is oriented at about 45° to the first sensing element, for example. In this example, the radius and angle values in operation 304, which are based at least in part on two of the three signals received in operation 302, can be used to determine the expected third sensor signal value (e.g., $V_{OUT\_CH3}$).

In operation 308, the expected value of the third sensor signal from operation 306 is compared with the received third channel signal in operation 302. As discussed above in connection with operation 302, the third channel signal can be a processed digital signal as similar signal processing can be performed for the first and second channel signals, from which the expected third channel signal is determined.

In operation 310, the processor 210 may determine whether the expected and received third channel signal difference is above a threshold. In some embodiments a suitable threshold can be set at a particular value or range of values, and in other embodiments, a suitable threshold may be set at a percentage value. In some embodiments, the threshold can be predefined and/or adjusted based on the specifications and other requirements of a system disclosed herein. In some embodiments, additional calculations can be performed to determine different types of errors, such as deviation from the expected $V_{RAD}$ value at a given temperature. If it is determined that the difference in the expected and actual third sensor signals is below a threshold, the process 300 continues to operation 312. If the difference is above the threshold or if it is determined that there are other errors, the process 300 continues to operation 314.

In operation 312, the process 300 can proceed to use the angle determined in operation 304 for further operations. Having confirmed that the angle sensing is accurate for the requisite specification, the system implementing aspects of the disclosure herein, e.g., the system 100 in FIG. 1A, can proceed with operations using the angle determined as above. For instance, the angle can be used in automotive ePAS applications or other power steering applications in motorized vehicles.

In operation 314, the processor 210 (FIGS. 2A-2B) may indicate that there is an error in angle measurement. An error can be indicated by setting an error flag. In some embodiments, the processor 210 may be configured to execute additional instructions responsive to detecting the angle sensor error, such as remedial processes or emergency procedures. Alternatively or additionally, the processor 210 may send data to other modules and/or other physical devices to indicate an error.

Aspects of this disclosure can be implemented in various electronic devices. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled"

together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more operations or actions for achieving the described method. The method steps and/or actions may be interchanged with one another without departing from the scope of the claims. In other words, unless a specific order of operations or actions is specified, the order and/or use of specific operations and/or actions may be modified without departing from the scope of the claims.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus for detecting sensor error, the apparatus comprising:
    a first sensing channel including a first magnetic sensing element;
    a second sensing channel including a second magnetic sensing element, the second magnetic sensing element oriented at a first angle relative to the first magnetic sensing element;
    a third sensing channel including a third magnetic sensing element, the third magnetic sensing element oriented at a second angle relative to the first magnetic sensing element, the second angle being different from the first angle; and
    a processor configured to:
        receive first sensor data from the first sensing channel, second sensor data from the second sensing channel, and third sensor data from the third sensing channel;
        compute expected third sensor data from the first sensor data and the second sensor data, wherein the first sensor data is associated with the first magnetic sensing element, wherein the second sensor data is associated with the second magnetic sensing element oriented at the first angle relative to the first magnetic sensing element, and wherein the expected third sensor data is expected data associated with the third magnetic sensing element oriented at the second angle relative to the first magnetic sensing element; and
        detect sensor error based at least partly on a comparison of the expected third sensor data with the third sensor data, wherein the third sensor data is associated with the third magnetic sensing element oriented at the second angle relative to the first magnetic sensing element.

2. The apparatus of claim 1, wherein the processor is further configured to determine a magnetic angle and a sensor output radius based at least partly on the first sensor data and the second sensor data, and wherein the processor is configured to compute the expected third sensor data based at least partly on the magnetic angle and the sensor output radius.

3. The apparatus of claim 2, wherein the processor is configured to compute the magnetic angle using an arctan function.

4. The apparatus of claim 1, wherein each of the first, second, and third magnetic sensing elements comprises a magnetoresistance sensor.

5. The apparatus of claim 1, wherein the second angle is approximately half of the first angle.

6. The apparatus of claim 1, wherein the first sensing channel comprises a first amplifier and a first sampling circuit, the second sensing channel comprises a second amplifier and a second sampling circuit, and the third sensing channel comprises a third amplifier and a third sampling circuit.

7. The apparatus of claim 1, wherein the first, second, and third sensing channels are embodied in a single die.

8. The apparatus of claim 1, wherein the first, second, and third magnetic sensing elements are collocated.

9. The apparatus of claim 1, wherein each of the first, second, and third magnetic sensing elements is configured to provide a differential output.

10. The apparatus of claim 1, wherein the apparatus is configured to provide an error flag responsive to the detected error satisfying a threshold.

11. The apparatus of claim 1, wherein the first magnetic sensing element, the second magnetic sensing element, and the third magnetic sensing element each comprise a full bridge.

12. An electronic power assisted steering system comprising the apparatus of claim 1.

13. A method for detecting sensor error, the method comprising:
 receiving first sensor data from a first sensing channel, second sensor data from a second sensing channel, and third sensor data associated with a third sensing channel;
 determining an angle based at least partly on the first sensor data from the first sensing channel and the second sensor data from the second sensing channel;
 computing the expected third sensor data based at least partly on the angle; and
 detecting sensor error based at least partly on a comparison of the expected third sensor data with the third sensor data associated with the third sensing channel,
 wherein the first sensing channel includes a first magnetic sensing element, wherein the second sensing channel includes a second magnetic sensing element, the second magnetic sensing element oriented at a first angle relative to the first magnetic sensing element, wherein the third sensing channel includes third magnetic sensing element, the third magnetic sensing element oriented at a second angle relative to the first magnetic sensing element, the second angle being different from the first angle.

14. The method of claim 13, wherein determining the angle comprises computing the angle using an arctan function.

15. The method of claim 13, wherein the computing the expected sensor error is also based on a radius determined from the first sensor data and the second sensor data.

16. The method of claim 13, wherein each of the first, second, and third magnetic sensing elements comprises an anisotropic magnetoresistance (AMR) sensor.

17. The method of claim 13, wherein the second angle is approximately half of the first angle.

18. An apparatus for detecting sensor error, the apparatus comprising:
 a first sensing channel including a first magnetic sensing element;
 a second sensing channel including a second magnetic sensing element, the second magnetic sensing element being oriented at an angle relative to the first magnetic sensing element;
 a third sensing channel; and
 a processor configured to:
  receive first sensor data from the first sensing channel, second sensor data from the second sensing channel, and third sensor data from the third sensing channel;
  determine an angle based at least partly on the first sensor data and the second sensor data, wherein the first sensor data is associated with the first magnetic sensing element, and wherein the second sensor data is associated with the second magnetic sensing element that is oriented at the angle relative to the first magnetic sensing element;
  compute expected third sensor data based at least partly on the angle; and
  detect sensor error based at least partly on a comparison of the expected third sensor data with the third sensor data.

19. The apparatus of claim 18, wherein the third sensing channel includes a third magnetic sensing element.

20. The apparatus of claim 19, wherein the first magnetic sensing element, the second magnetic sensing element, and the third magnetic sensing element each comprise a full bridge anisotropic magnetoresistance (AMR) sensor.

* * * * *